United States Patent
Terada et al.

(10) Patent No.: US 8,530,858 B2
(45) Date of Patent: Sep. 10, 2013

(54) TRANSMISSION ELECTRON MICROSCOPE APPARATUS COMPRISING ELECTRON SPECTROSCOPE, SAMPLE HOLDER, SAMPLE STAGE, AND METHOD FOR ACQUIRING SPECTRAL IMAGE

(75) Inventors: Shohei Terada, Hitachinaka (JP); Yoshifumi Taniguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 231 days.

(21) Appl. No.: 13/000,593

(22) PCT Filed: Jun. 11, 2009

(86) PCT No.: PCT/JP2009/061062
§ 371 (c)(1),
(2), (4) Date: Mar. 18, 2011

(87) PCT Pub. No.: WO2009/157358
PCT Pub. Date: Dec. 30, 2009

(65) Prior Publication Data
US 2011/0155906 A1 Jun. 30, 2011

(30) Foreign Application Priority Data
Jun. 27, 2008 (JP) ................ 2008-168044

(51) Int. Cl.
*H01J 37/26* (2006.01)
(52) U.S. Cl.
USPC ...... 250/440.11; 250/306; 250/307; 250/310; 250/311
(58) Field of Classification Search
USPC ............... 250/305, 306, 307, 309, 310, 311, 250/440.11
See application file for complete search history.

(56) References Cited

U.S. PATENT DOCUMENTS

| 2002/0096632 | A1 | 7/2002 | Kaji et al. |
| 2004/0129878 | A1* | 7/2004 | Tomimatsu et al. .......... 250/307 |

(Continued)

FOREIGN PATENT DOCUMENTS

| JP | 06-168689 | 6/1994 |
| JP | 10-302700 | 11/1998 |

(Continued)

OTHER PUBLICATIONS

European Search Report issued in European Patent Application No. EP 09770068.6 dated Jun. 29, 2012.

(Continued)

*Primary Examiner* — Nicole Ippolito
(74) *Attorney, Agent, or Firm* — McDermott Will & Emery LLP

(57) ABSTRACT

A transmission electron microscope apparatus, a sample holder and a sample stage and a method for acquiring spectral images as well are provided which can acquire spectral images at a time from a plurality of samples and measure highly accurate chemical shifts from electron energy loss spectra extracted from the spectral images. A transmission electron microscope apparatus comprises an electron gun for emitting an electron beam, a condenser lens for converging the emitted electron beam, a plurality of sample stages radiated with a converged electron beam and adapted to mount samples, a sample movement control unit for moving the sample stages, image-forming lenses for forming an image of an electron beam having transmitted through the plural samples, an electron spectrometer adapted to perform spectrometry of the electron beam in accordance with energy amounts the image-formed electron beam has and deliver spectral images obtained at convergence positions which are different in energy dispersion axis direction and in a direction orthogonal to the energy dispersion axis direction to thereby acquire spectral images from the plural samples at a time, and an image display unit for displaying acquired spectral images.

14 Claims, 7 Drawing Sheets

(56) References Cited

U.S. PATENT DOCUMENTS

2004/0169143 A1* 9/2004 Kaji et al. .................... 250/310
2007/0045534 A1* 3/2007 Zani et al. .................... 250/309

FOREIGN PATENT DOCUMENTS

| JP | 2000-113854 | 4/2000 |
| JP | 2002-157973 | 5/2002 |
| JP | 2003-151478 | 5/2003 |
| JP | 2004-178980 | 6/2004 |
| JP | 2007-033186 | 2/2007 |

OTHER PUBLICATIONS

Japanese Office Action issued in Japanese Patent Application No. JP 2012-010590 dated Mar. 26, 2013.

* cited by examiner (a) TRANSMISSION ELECTRON MICROSCOPIC IMAGE (b) SPECTRAL IMAGE (c) ELECTRON ENERGY LOSS SPECTRA OBTAINED FROM INDIVIDUAL LOCATIONS

INCIDENT DIRECTION OF ELECTRON BEAM

ENERGY DISPERSION AXIS

INCIDENT DIRECTION OF ELECTRON BEAM

ENERGY
DISPERSION AXIS

TRANSMISSION ELECTRON MICROSCOPE APPARATUS COMPRISING ELECTRON SPECTROSCOPE, SAMPLE HOLDER, SAMPLE STAGE, AND METHOD FOR ACQUIRING SPECTRAL IMAGE

RELATED APPLICATIONS

This application is a U.S. National Phase under 35 U.S.C. §371 of International Application No. PCT/JP2009/061062, filed on Jun. 11, 2009, which in turns claims the benefit of Japanese Application No. 2008-168044, filed on Jun. 27, 2008, the disclosures of which Applications are incorporated by reference herein.

TECHNICAL FIELD

The present invention relates to a transmission electron microscope apparatus having an electron spectrometer, a sample holder and a sample stage and to a spectral image acquisition method as well which can acquire spectral images at a time from a plurality of samples and measure highly accurate chemical shifts from electron energy loss spectra extracted from the spectral images.

BACKGROUND ART

With working dimensions of a silicon semiconductor, a magnetic device and the like reduced minutely and with high integration advanced, degradation in device characteristics and decrease in reliability have brought about more important problems than before. In recent years, in order to analyze defects of semiconductor device in a nanometer region and ascertain causes of defects thoroughly to solve them in the course of development of new processes and mass-production, spectral analysis and two-dimensional element distribution analysis using (scanning) transmission electron microscopy: (S) TEM) and electron energy loss spectroscopy: EELS) have become indispensable analysis means.

The electron energy loss spectrum can mainly be classified into a zero spectrum developing when passing through a sample do not loss energy, a plasmon spectrum obtained when electrons lose energy by exciting electrons in a valance electron band and an inner shell electron excitation loss spectrum obtained when electrons lose energy by exciting inner shell electrons. In the inner shell electron excitation loss (core loss) spectrum, a fine structure can be observed near an energy loss edge.

This structure is called an energy loss near-edge structure (ELNES) and has information reflecting the electron state and chemical bond state of a sample. The energy loss value (energy loss near-edge position) is inherent to an element and therefore, makes its qualitative analysis possible. Further, since information concerning coordination in the neighbor of a noticed element can be obtained from a shift of the energy loss near-edge position called a chemical shift, a simplified state analysis can be made.

Conventionally, when acquiring electron energy loss spectra at different locations on a sample, a scanning transmission electron microscope adapted to cause a finely focused electron beam to scan on the sample by means of a scanning coil and an electron spectrometer capable of performing spectroscopy by using an energy amount the electron beam has are used in combination in order that an electron beam having transmitted through the sample can undergo spectroscopy and electron energy loss spectra can be obtained in succession.

In the case of the above method, however, the aberration of electron energy loss spectrum and the origin position will change owing to a drift of accelerating voltage of the electron beam concomitant with a change in external disturbance in the neighbor of the apparatus and with changes in magnetic field and electric field, making it difficult to compare the shape of energy loss near-edge structure of electron energy loss spectrum and a slight chemical shift as well at a measurement location with those at another measurement location.

Then, Patent Literature 1, for example, describes a method according to which short-time measurements are conducted plural times by using a two-dimensional position detection device composed of a plurality of pixels and then, pixels at which the spectrum intensity of electron beam is maximized are detected in respect of detected values of the individual pixels in the individual measurements conducted plural times, the two-dimensional detection device is shifted so that pixel positions at which the spectrum intensity of electron beam is maximized in the individual measurements may coincide with each other, pixels whose positions are coincidental at that time are identified as pixels for the same energy value, and detection values in the individual measurements are integrated to make a long-time measurement possible.

For example, Patent Literatures 2 and 3 describe that a peak of spectrum is detected with an electron beam detector, a shift amount by which the peak position shifts from a reference location on the electron beam detector is detected, the shift amount is corrected by using an electron beam position control unit for controlling the electron beam position on the electron beam detector and besides, while controlling the correction of the peak position of spectrum for its shift amount and the spectrum measurement based on the electron beam detector, electron energy loss spectra are measured.

In the aforementioned technique, the energy shift (drift) concomitant to the change of apparatus external disturbance or the like during the measurement is corrected and then the electron energy loss spectra are measured but a spectrum used for detection of the shift amount and a spectrum associated with an analysis objective can not always be acquired at a time, making it difficult to correct the shift amount of peak position completely.

Further, electron energy loss spectra at a plurality of locations are not acquired at a time and so, when chemical shifts of electron energy loss spectra obtained at individual locations are compared with one another in detail, it is difficult as in the case of conventional techniques to decide whether the shift is due either to a chemical shift reflecting a difference in chemical bond state or to an external disturbance.

Then, Patent Literature 4, for example, describes that whilst a typical transmission electron microscope produces a transmission electron microscopic image for which focal positions in both the x and y axes are on the same plane, the aforementioned transmission electron microscope is provided with an electron spectrometer to make focal positions in x and y axes different from each other, thus ensuring that a two-dimensional image having a spectral plane at a focal position on x axis and an image plane at a focal position on y axis can be obtained with an image detector.

As a consequence, an electron energy loss spectrum in y direction of a sample can be separated and observed. In other words, the image obtained by means of the image detector can be observed as a spectral image showing an energy loss amount, that is, energy dispersion axis on x axis and showing position information of the sample on y axis as illustrated at (b) in FIG. 2. The spectral image is observed in a band form corresponding to individual laminated layer films of a transmission microscopic image as shown at (a) in FIG. 2. Then, when intensity profiles of the spectral image are extracted at individual locations corresponding to the respective laminated layer films shown at (a) in FIG. 2, electron energy loss spectra at different positions of the sample can be observed at a time as shown at (c) in FIG. 2, so that energy loss near-edge structures and slight chemical shifts of electron energy loss spectra at different positions can be compared with one another in detail.

The spectral image showing the energy loss amount on x axis and the position information of sample on y axis as described in Patent Literature 4 is a two-dimensional image obtained with the image detector by changing the lens function of the electron spectrometer or the like to make focal positions different in x and y axes, proving that electron energy loss spectra at plural different positions of the sample can be observed at a time. The conventional technique gives a disclosure of a technique aiming at the fact that spectral images, that is, electron energy loss spectra are captured from plural different points in a single sample to discus chemical shifts due to differences in chemical bond states but it fails to disclose that spectral images are obtained simultaneously from a plurality of samples to measure electron energy loss spectra and chemical shifts and hence, fails to obtain spectral images from the plural samples at a time.

CITATION LIST

Patent Literatures

Patent Literature 1: JP-A-2000-113854
Patent Literature 2: JP-A-2002-157973
Patent Literature 3: JP-A-2003-151478
Patent Literature 4: JP-A-10-302700

SUMMARY OF INVENTION

Technical Problems

An object of this invention is to provide a transmission electron microscope apparatus, a sample holder and a sample stage and a method for acquiring spectral images as well which can acquire spectral images at a time from a plurality of samples and measure highly accurate chemical shifts from electron energy loss spectra extracted from the spectral images.

Solution of Invention

Namely, a transmission electron microscope apparatus according to an embodiment of this invention comprises an electron gun for emitting an electron beam, a condenser lens for converging the emitted electron beam, a plurality of sample stages radiated with a converged electron beam and adapted to mount samples, a sample movement control unit for moving the sample stages, image-forming lenses for forming an image of an electron beam transmitting through the plural samples, an electron spectrometer adapted to perform spectrometry of the electron beam in accordance with energy amounts the image-formed electron beam has and deliver spectral images obtained at convergence positions which are different in energy dispersion axis direction and in a direction orthogonal to the energy dispersion axis direction to thereby acquire spectral images from the plural samples at a time, and an image display unit for displaying acquired spectral images.

A sample holder according to an embodiment of the invention is a sample holder for a transmission electron microscope apparatus provided with an electron spectrometer, wherein the sample holder has a plurality of sample stages mounted with samples and the samples are arranged in a direction orthogonal to the energy dispersion axis of the electron spectrometer.

A sample stage according to an embodiment of the invention is a sample stage for mounting a sample for a transmission electron microscope apparatus, wherein the sample stage has, on the opposite side to its sample stage fixing portion, a projecting portion for mounting a sample for the transmission electron microscope apparatus.

A method for acquiring spectral images according to an embodiment of the invention is a method for acquiring spectral images obtained by a transmission electron microscope apparatus provided with an electron spectrometer which are formed in two orthogonal axes of energy dispersion axis and position information, wherein spectral images are captured simultaneously from a plurality of samples.

A method for acquiring spectral images according to another embodiment of the invention is a method for acquiring spectral images obtained by a transmission electron microscope apparatus provided with an electron spectrometer which are formed in two orthogonal axes of energy dispersion axis and position information, wherein a plurality of samples are arranged in the energy dispersion axis and spectral images are captured simultaneously from the plural samples.

Advantageous Effects Of Invention

According to the present invention, a transmission electron microscope apparatus, a sample holder and a sample stage and a spectral image acquisition method as well which can acquire spectral images at a time from a plurality of samples and measure highly accurate chemical shifts from electron energy loss spectra extracted from the spectral images.

DESCRIPTION OF EMBODIMENTS

Figure 1:
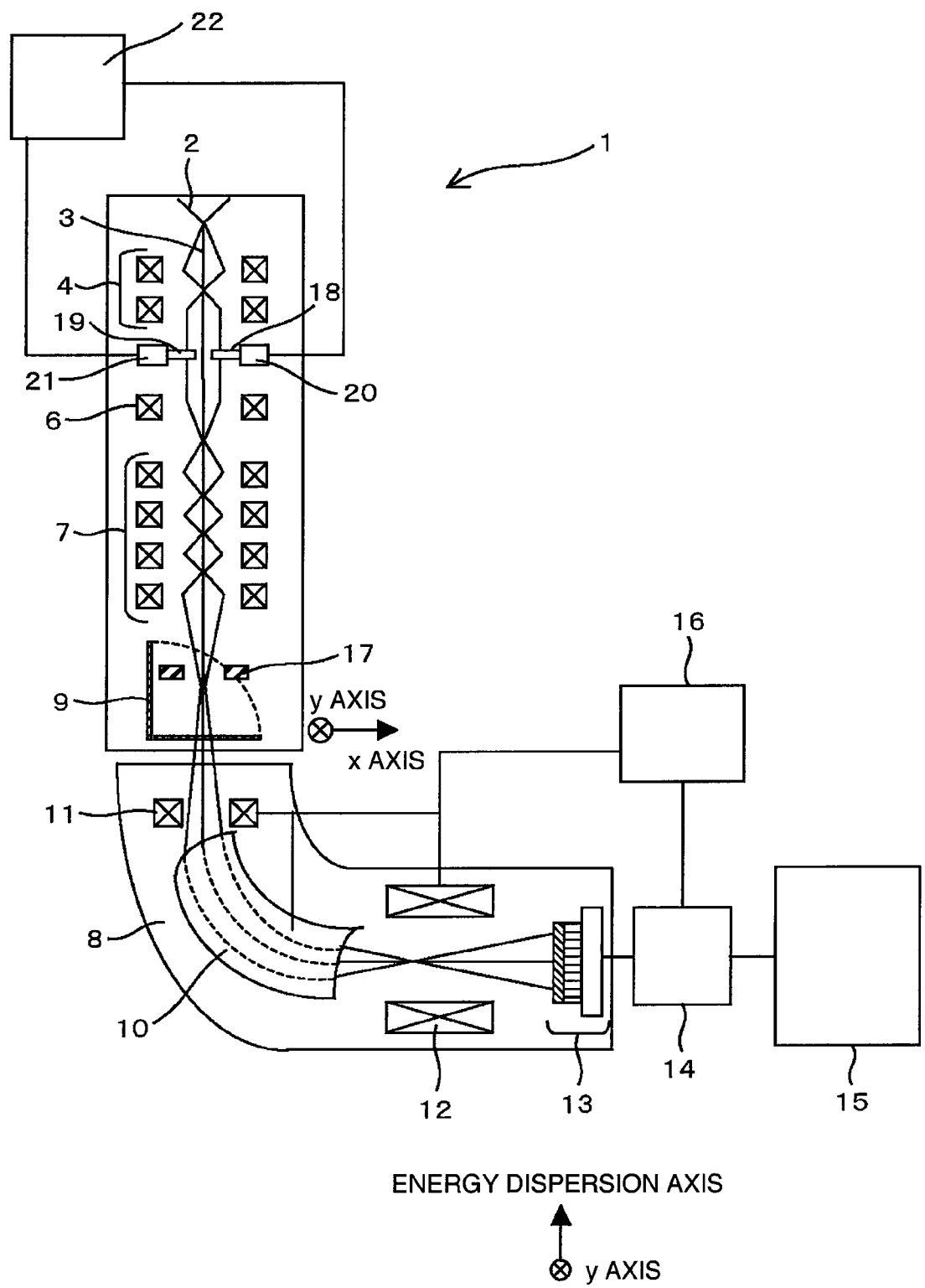
FIG. 1 is a schematic diagram illustrating diagrammatically the construction of a transmission electron microscope apparatus according to an embodiment of the present invention.
Figure 2:
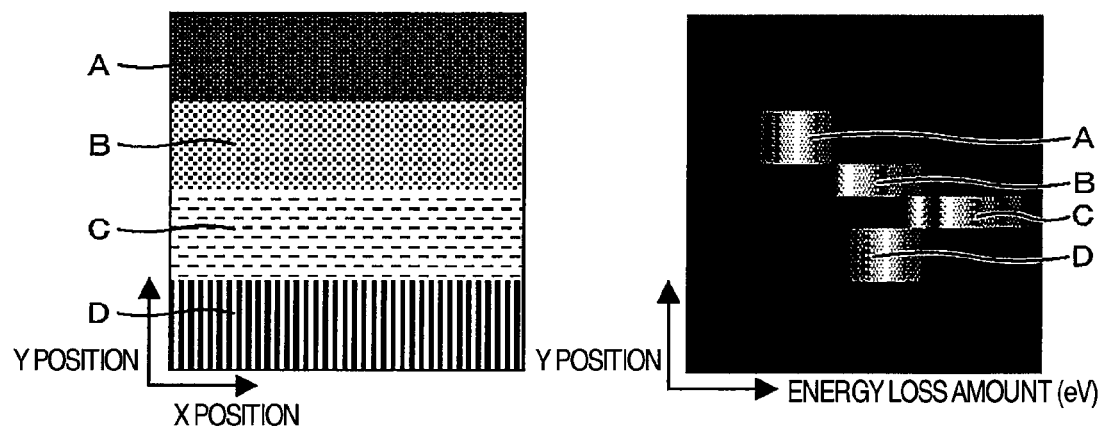
FIG. 2 shows a transmission electron microscopic image, spectral images and electron energy loss spectra obtained according to the prior arts.
Figure 2:
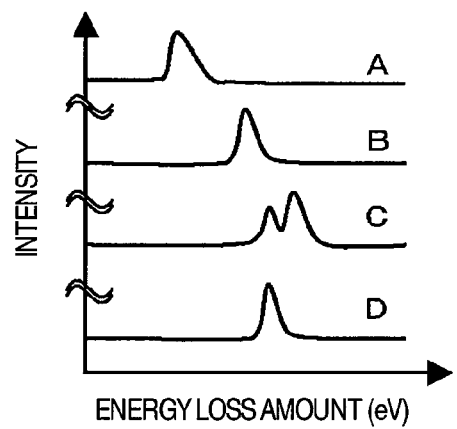

Embodiments for carrying out the present invention will now be described with reference to the drawings. In all of the drawings for explaining the embodiments, identical parts are designated by identical reference numerals and their description will be omitted partly.

The schematic construction of a transmission electron microscope apparatus according to one embodiment of the present invention is illustrated diagrammatically in FIG. 1. The transmission electron microscope apparatus 1 has an electron spectrometer 8.

The transmission electron microscope apparatus 1 of the present embodiment comprises an electron gun having an electron source 2 and adapted to emit an electron beam 3, a condenser lens 4, an objective lens 6, an image-forming lens system 7 (image-forming lenses), a phosphor plate 9, the electron spectrometer 8, an image display unit 14, a data memory unit 15 and a central control unit 16. Between condenser lens 4 and objective lens 6, a plurality of samples 18 and 19 are mounted to sample stages 20 and 21. The sample stages 20 and 21 are connected to a sample movement control unit 22 for moving the sample stages 20 and 21.

The electron spectrometer 8 includes a magnetic field selector 10, multi-pole lenses 11 and 12 and an image detector 13.

It will be appreciated that the construction of transmission electron microscope apparatus 1 and the construction of electron spectrometer 8 are not limited to the above ones. The transmission electron microscope apparatus 1 comprising at least the electron gun, condenser lens 4, plural sample stages 20 and 21, sample movement control unit 22, image-forming lens system 7, electron spectrometer 8 and image display unit 14 may suffice.

Also, the position where the electron spectrometer 8 is arranged is not limited particularly. In the present embodiment, the electron spectrometer 8 is arranged between the phosphor plate 9 and the image display unit 14 but the electron spectrometer 8 may be arranged between lenses of the image-forming lens system 7.

In the transmission electron microscope apparatus 1, the electron beam 2 emitted from the electron source 2 passes through the condenser lens 4 and is irradiated on the samples 18 and 19. An electron beam 3 having transmitted through the samples 18 and 19 passes through the objective lens 6 and the image-forming lens system 7 constituted by a plurality of lenses and when the phosphor plate 9 is opened, the electron beam 3 kept intact enters the electron spectrometer 8.

The electron beam 3 having entered the electron spectrometer 8 passes through the multi-pole lenses 11 and 12 used for focusing, enlargement/reduction, aberration reduction or the like of electron energy loss spectrum and transmission electron microscopic image and through the magnetic field selector 10 capable of performing spectroscopy in accordance with energy amounts the electron beam 3 has and subsequently, it is picked up in the form of a transmission electron microscopic image, a two-dimensional element distribution image and a spectral image by means of the image detector 13 and thereafter, displayed on the image display unit 14 and then stored in the data memory unit 15. The magnetic field selector 10 and multi-pole lenses 11 and 12 are controlled by means of the central control unit 16. In the central control unit 16, switching the modes of capturing the transmission electron microscopic image, the two-dimensional element distribution image and the spectral image can be controlled. Further, changing the focal positions on x axis and y axis, that is, switching the modes of acquiring the transmission electron microscopic image and the spectral image can also be controlled.

In the case of capturing a spectral image, in order to limit the location where a spectrum is desired to be acquired, a selected-area slit 17 may sometimes be inserted which is short in x axis direction, that is, in the same direction as energy dispersion direction and is long in y axis direction, that is, in sample measurement position direction.

The samples 18 and 19 are mounted to the sample stages 20 and 21, respectively, and the samples 18 and 19 are moved independently of each other by means of the sample movement control unit 22. The samples 18 and 19 are disposed at positions orthogonal to the energy dispersion axis of electron spectrometer 8 and they are moved as necessary so that electron energy loss spectra of the samples 18 and 19 can be acquired simultaneously. The movement can be carried out while confirming the positions of samples 18 and 19 by means of the phosphor plate 9 and image display unit 14. The number of samples is not limited to two.

Figure 3:
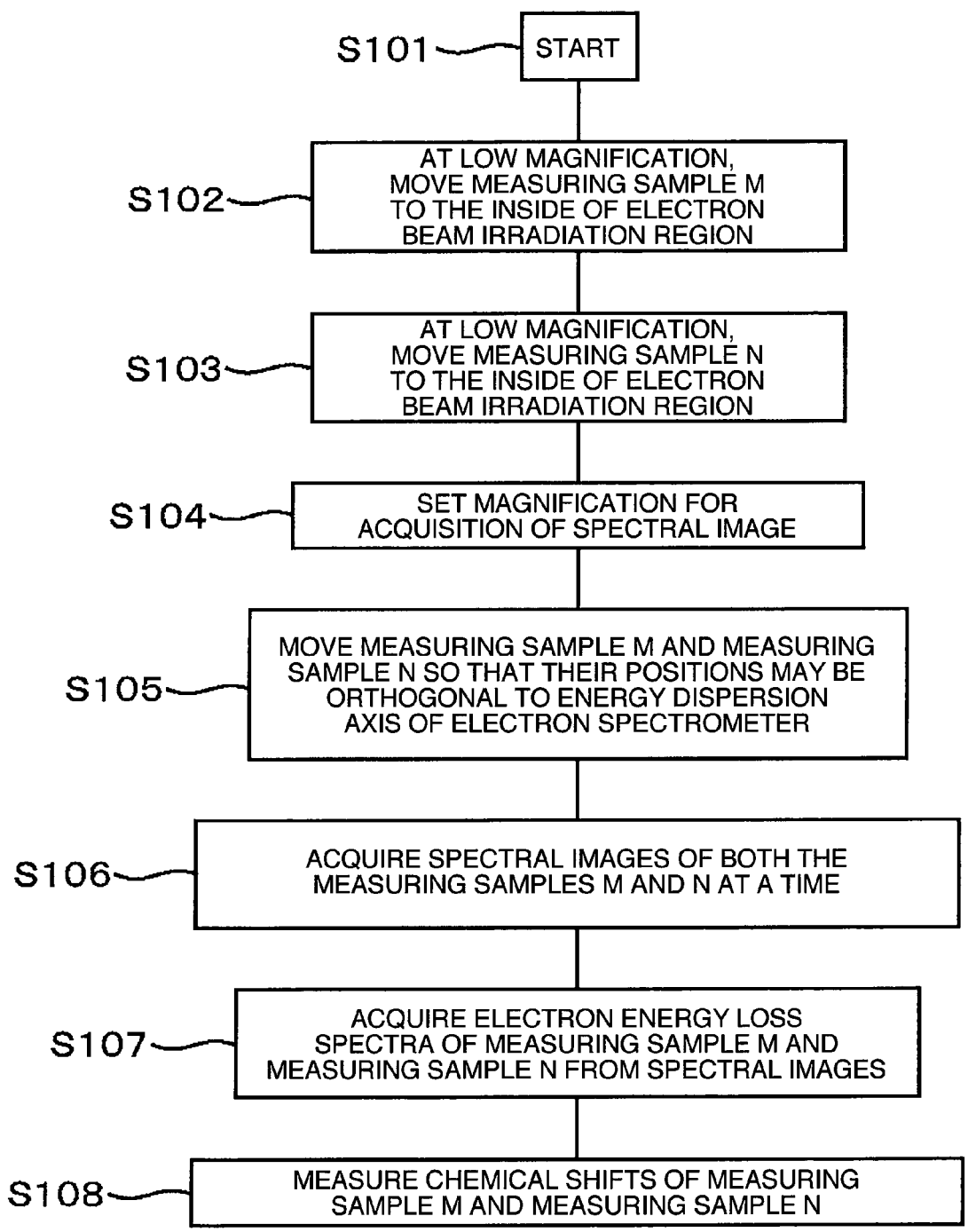
FIG. 3 is a flowchart showing procedures for obtaining electron energy loss spectra and chemical shifts from standard samples of different samples and from a measurement objective sample.

Illustrated in FIG. 3 is a flowchart showing procedures of acquiring electron energy loss spectra and chemical shifts from the plural samples by using the transmission electron microscope apparatus shown in FIG. 1. In the present flowchart, the number of samples is set to 2 but this is not limitative and a plurality amounting up to two or more may be adopted.

Firstly, the magnification of transmission electron microscope apparatus 1 is set to a low value and a measuring sample M is moved by means of the sample movement control unit 22 to an electron beam irradiation region, that is, to a position where the sample is observable with the phosphor plate 9 or image detector 13 (S101-102). Next, like the movement of measuring sample M, a measuring sample N is moved to the electron beam irradiation region (S103). Here, the movement of any one of measuring sample M and measuring sample N may be earlier than that of the other. In this phase, it is preferable that the measuring sample M is as close to the measuring sample N as possible.

Next, the magnification of transmission electron microscope apparatus 1 is set to a magnification for acquiring spectral images (S104). Unless the measuring sample M and the measuring sample N are located in the same view field at the present magnification, they will be so moved as to be disposed in the same view field by means of the sample movement control unit 22. In this case, the disposition in the same view field means that spectral images of measuring sample M and measuring sample N are allowed to be captured concurrently. The measuring sample M may be in contact with the measuring sample N or the presence of a space between the samples does not matter particularly.

Subsequently, the measuring samples M and N are moved by means of the sample movement control unit 22 so that their positions may be orthogonal to the energy dispersion axis of the electron spectrometer 8 (S105). In this case, with a mark indicative of a direction orthogonal to the energy dispersion axis applied to the image display unit 14 on which a two-dimensional image obtained through the phosphor plate 9 or the image detector 13, the two samples can be moved efficiently.

After the measuring sample M and the measuring sample N are disposed as described above, spectral images of the measuring samples M and N are acquired at a time by means of the electron spectrometer 8 (S106). Electron energy loss spectra of the measuring samples M and N are extracted from the spectral images (S107) and thereafter, chemical shifts of the measuring samples M and N are measured (S108).

Figure 4:
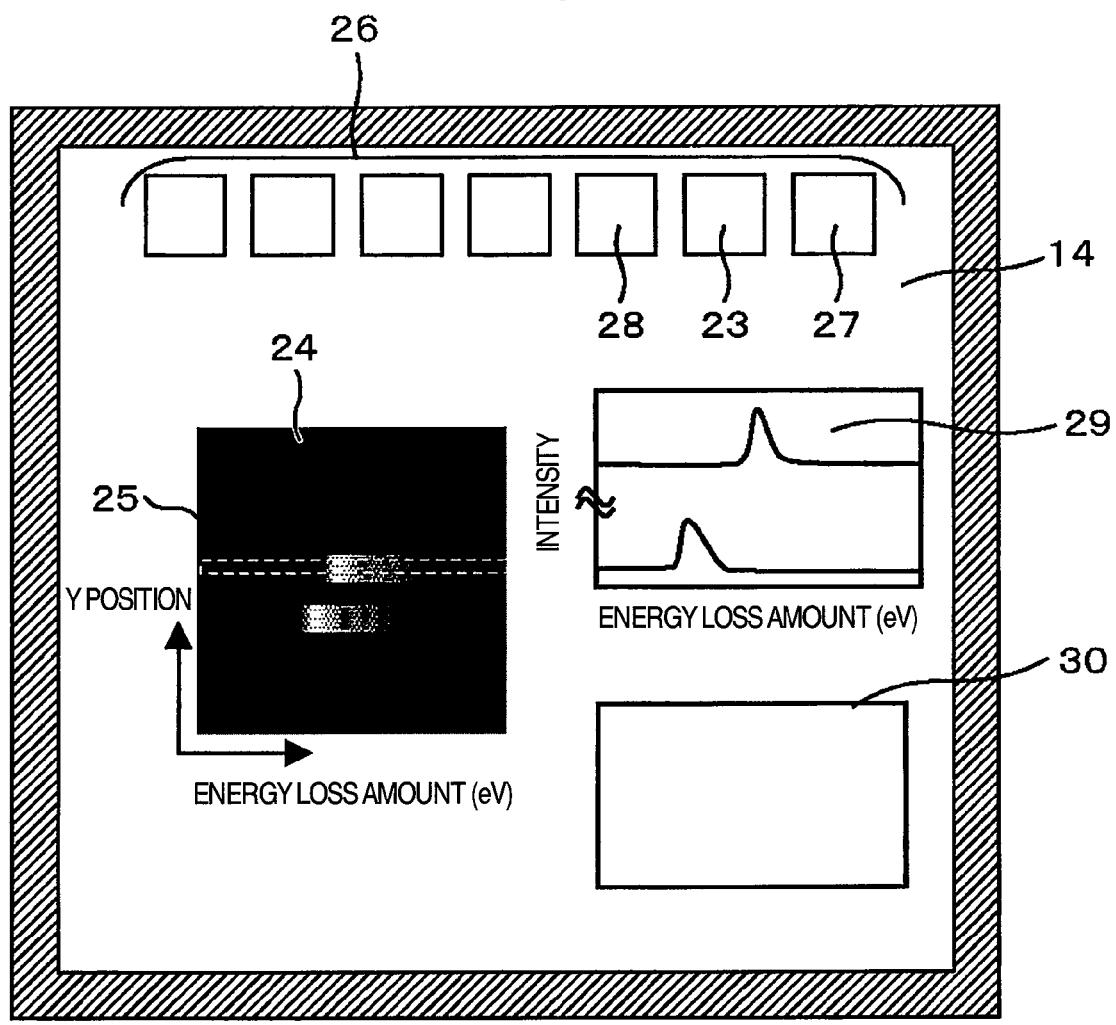
FIG. 4 is a diagram showing an example of the interior of an image display unit in the transmission electron microscope apparatus.

Next, operation conducted by the operator and the operation designation screen of transmission electron microscope apparatus 1 will be described. Illustrated in FIG. 4 is an example of the display contents in the image display unit 14. A selection button group 26 includes a spectrum measurement start button 28, a spectrum take-in end button, a spectrum take-in time change button, a spectrum extraction button 23 and a chemical shift measurement button 27. For example, when the spectrum measurement start button 28 in selection button group 26 is selected, spectral images 24 acquired simultaneously from a plurality of samples by means of the image detector 13 are displayed on the image display unit 14.

When the spectrum extraction button 23 in selection button group 26 is selected, a spectrum selection region tool 25 is displayed in the spectrum images 24 and concurrently therewith, a display area 29 of electron energy loss spectra extracted from the spectrum selection region tool 25 is displayed. Since the spectrum selection region tool 25 can be moved freely in positional direction and the width of an extraction region is variable, a spectrum at an arbitrary position can be set.

An electron energy loss spectrum extracted from an arbitrary position can be displayed in the electron energy loss spectrum display area 29 and for example, electron energy loss spectra extracted from the individual samples can be displayed at a time.

When the chemical shift measurement button 27 in selection button group 26 is selected, a chemical shift obtained from the electron energy loss spectrum displayed in the electron energy loss spectrum display area 29 is displayed in a chemical shift display area 30.

Here, a method of calculating an energy loss near-edge necessary for determining a chemical shift from a plurality of electron energy loss spectra will be described. A chemical shift can be obtained by determining an energy difference between energy loss near-edges of individual electron energy loss spectra.

As the method for calculating an energy loss near-edge of an electron energy loss spectrum obtained from a position set by the spectrum selection region tool 25, a maximum value method, a differential method, an intermediate value method and so on can be enumerated exemplarily.

In the maximum value method, an energy value of the maximum intensity within an arbitrary energy range is calculated as an energy loss near-edge. Then, the differential method is a method in which a spectrum is once primarily differentiated and thereafter, an energy value of the maximum intensity of the differentiated spectrum is calculated as an energy loss near-edge.

The method for calculating an energy loss near-edge according to the intermediate value method is as follows. 1) A difference between the maximum intensity of spectra and a background region is calculated. 2) An intensity of the half of the difference is subtracted from all spectra. 3) An absolute value of intensity at energy of each of the spectra is determined. 4) An energy value of the minimum intensity within an arbitrarily set energy range is calculated as an energy loss near-edge.

The present procedure is an example showing the calculation method for the energy loss near-edge and the calculation method is not limited particularly to the aforementioned ones.

The above-described buttons of respective functions can be moved suitably and disposed within the image display unit 14. Further, the buttons of respective functions may be tool bars. Furthermore, the spectral images 24, electron energy loss spectrum display area 29 and chemical shift display area 30 which are displayed in the image display unit 14 can also be disposed freely.

Figure 5:
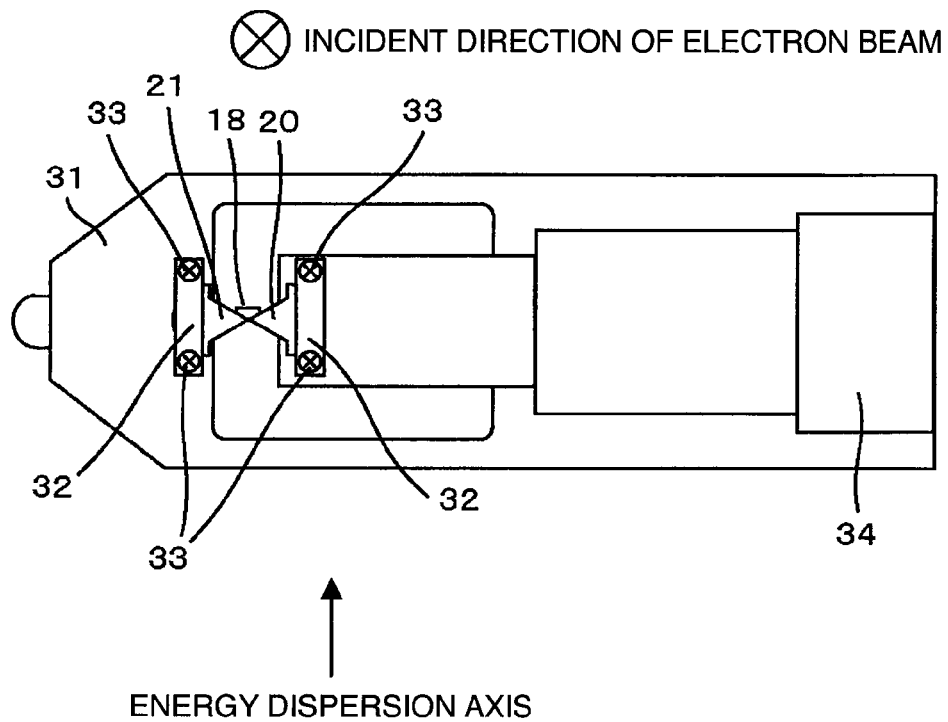
FIG. 5 is a top view of a side entry type sample holder for the transmission electron microscope apparatus of the invention.

The sample holder for transmission electron microscope apparatus capable of mounting a plurality of sample stages is illustrated in top view form in FIG. 5. In the present embodiment, a side entry type sample holder for transmission electron microscope apparatus will be described. Externally of the transmission electron microscope apparatus, the sample holder is mounted with a plurality of sample stages mounting samples and thereafter, it is inserted to a high vacuum chamber of the transmission electron microscope apparatus laterally thereof.

Mountable to the sample holder 31 are sample stages 20 and 21 mounted with different samples 18, respectively, and each of the sample stages is fixed to the body of sample holder 31 by means of a sample stage clamp 32 and sample stage clamp screws 33. The manner of fixing the sample stage is not limited to the above. Besides, the respective samples can be situated in a direction orthogonal to the energy dispersion axis.

The body of sample holder 31 is provided with a piezoelectric device 34 to enable the sample movement control unit 22 to freely move the sample stage 20 mounted with the sample in triple axial directions. This ensures that the plural samples can be situated with high accuracy in a direction orthogonal to the energy dispersion axis.

Figure 6:
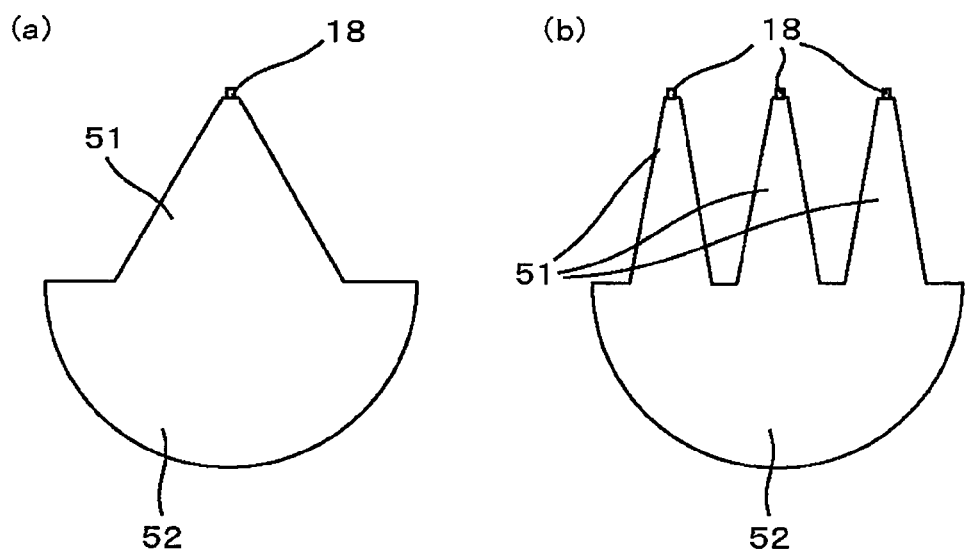
FIG. 6 shows at (a) and (b) examples of the sample stages for mounting samples in the present invention.

An example of the sample stage for mounting samples according to an embodiment of the invention is illustrated in FIG. 6. The sample stage has, on opposite side to its sample fixing portion 52, a projecting portion 51 for mounting a sample and a desired sample is mounted thereto by means of, for example, a focused ion-beam apparatus. Whilst the projecting portion 51 has a single projection for mounting a sample as shown at (a) in FIG. 6, it has three projections as shown at (b) in FIG. 6 and accordingly, by changing the shape of sample stage 20 as necessary, a plurality of measuring samples can be mounted.

Figure 7:
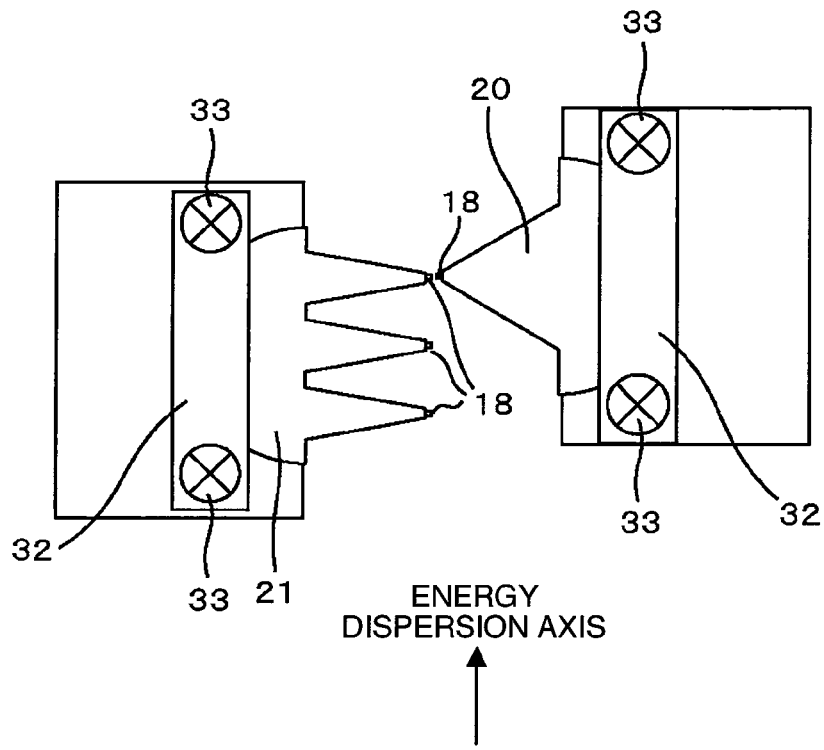
FIG. 7 is a diagram for explaining an example of mounting the sample stages to the sample holder.

The sample stages shown in FIG. 6 are mounted to the sample holder as exemplified in FIG. 7, indicating that the sample stage 20 has one projection and the sample stage 21 has three projections, with different samples mounted to respective projections. Samples are used in arbitrary combination for obtaining spectral images at a time and the sample stage 20 can be moved freely by means of the piezoelectric device 34 inside the body of sample holder 31 to acquire spectral images.

Figure 8:
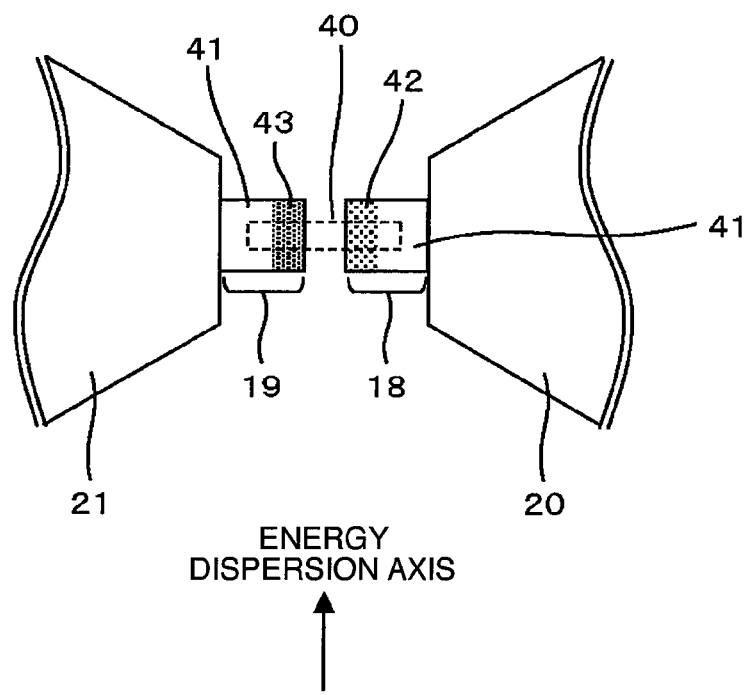
FIG. 8 is a diagram for explaining an example where samples are arranged on 2 sample stages.

Referring to FIG. 8, an instance according to the present invention is shown in which samples are mounted to two sample stages and the samples are set to be close to each other to permit spectral images of the two to be acquired at a time. The sample stages 20 and 21 are mounted with samples 18 and 19 by means of the focused ion-beam apparatus. Further, the samples 18 and 19 are so thinned by means of the focused ion-beam apparatus as to permit spectral images to be acquired.

The sample 18 is a sample having a silicon (Si) substrate 41 on which nickel silicide 42 is laminated and the sample 19 is a sample having a silicon substrate 41 on which nickel di-silicide 43 is laminated, the both samples having each a sectional structure. In FIG. 8, a dotted-line portion indicates a spectral image acquisition region 40 in which spectral images of the samples 18 and 19 can be acquired simultaneously.

The samples 18 and 19 are not limited to the samples thinned by means of the focused ion-beam apparatus but for example, nano-particles or carbon nanotubes may also be fixed to the sample stages 20 and 21.

Figure 9:
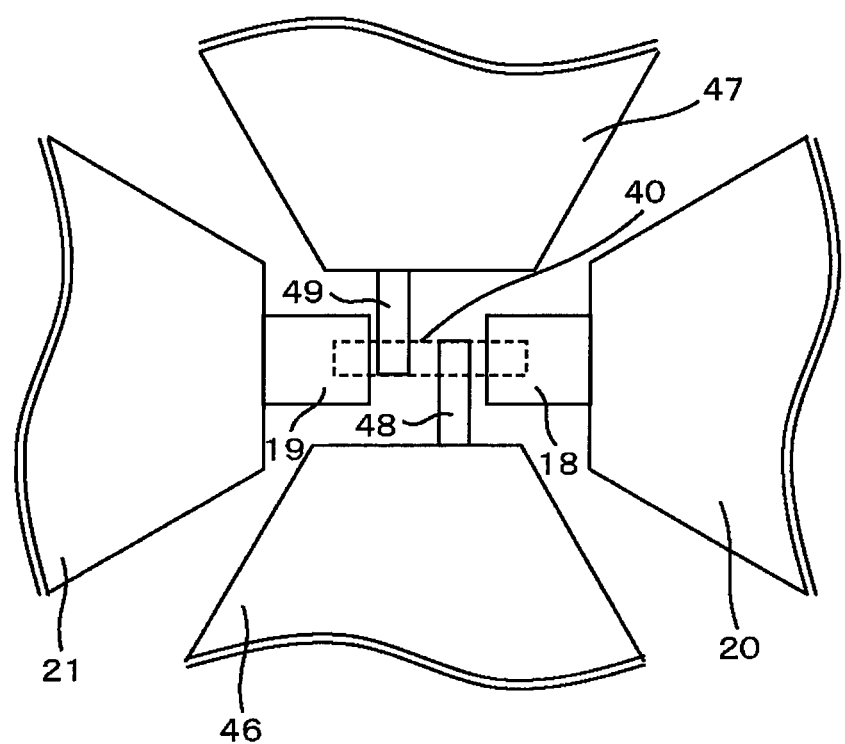
FIG. 9 is a diagram for explaining an example where samples are arranged on 4 sample stages.
Figure 9:

Turning to FIG. 9, an instance according to the invention is illustrated in which samples are mounted to four sample stages. Sample stages 46 and 47 are added to the above-described sample stages 20 and 21 and samples 48 and 49 are mounted to the sample stages 46 and 47. In the present embodiment, too, spectral images of all samples can be acquired at a time.

Next, a specified example of simultaneous acquisition of spectral images of the aforementioned plural samples will be described. The present specified example was executed by using the transmission electron microscope apparatus 1 and spectral images were acquired from two samples at a time by using the body of sample holder 31 of the invention and chemical shifts of electron energy loss spectra obtained from the spectral images were measured. The measuring samples were a sample (measuring sample M) resulting from thinning the section of a sample having a silicon substrate on which nickel silicide (NiSi) is laminated by 20 nm and a sample (measuring sample N) resulting from thinning the section of a sample having a silicon substrate on which nickel di-silicide ($NiSi_2$) is laminated by 20 nm and they were mounted to the respective sample stages.

During acquisition of spectral images, the accelerating voltage of transmission electron microscope apparatus 1, the electron beam 3 intake angle and the energy dispersion were set to 200 kV, 6 mrad and 0.05 eV/pixel, respectively. The image detector 13 used for acquisition of spectral images is a two-dimensional detector of 1024 pixels×1024 pixels.

Firstly, the observation magnification of transmission electron microscope apparatus 1 was set to 200 times and the measuring sample M was moved to the inside of an irradiation region of electron beam 3. Subsequently, the sample movement control unit 22 was used to cause the measuring sample N to approach the measuring sample M as closely as possible. Positions of the two were confirmed by using an image on the phosphor plate 9 and the two samples were so moved as to be situated as centrally of the phosphor plate 9 as possible.

Next, after the observation magnification on display in the transmission electron microscope apparatus 1 was changed to 10000 times and the measuring sample N was moved so that the measuring sample M and measuring sample N may be orthogonal to the energy dispersion axis of electron spectrometer 8, the measuring sample N was further approached to make simultaneous acquisition of spectral images of measuring samples M and N possible. In this phase, the positions of the two were confirmed by using transmission electron microscopic images obtained from the image detector 13.

Next, the spectrum extraction button 23 in spectrum selection button 21 was selected and spectral images of the measuring samples M and N were acquired at a time. The spectral images were captured in an L shell energy loss near-edge region of silicon and an L shell energy loss near-edge region of nickel.

In connection with the spectral images obtained from the silicon L shell energy loss near-edge region, the silicon substrate portion, nickel silicide portion and nickel di-silicide portion were set by means of the spectrum selection region tool 25 and thereafter, the spectrum extraction button 23 was selected to extract electron energy loss spectra from the respective portions. After the extraction of electron energy loss spectra, the chemical shift measurement button 27 was selected to measure chemical shifts at silicon L shell energy loss near-edge positions in the silicon substrate portion, nickel silicide portion and nickel di-silicide portion. For measurement of the energy loss near-edge position, the intermediate value method was used. As a result, no chemical shift was found between the two measuring samples.

Next, in connection with the spectral images obtained from the nickel L shell energy loss near-edge region, the nickel silicide portion and nickel di-silicide portion were set by means of the spectrum selection region tool 25 and thereafter, the spectrum extraction button 23 was selected to extract electron energy loss spectra from the respective portions. After the extraction of electron energy loss spectra, the chemical shift measurement button 27 was selected to measure chemical shifts of the two measuring samples. The energy loss near-edge position was determined by similarly using the intermediate value method this time. As a result, it was found that for the nickel di-silicide, an about 2 eV higher loss energy shift develops. Conventionally, lamination of both the nickel silicide and nickel di-silicide in a single sample was difficult to achieve. Thus, highly accurate measurement of a chemical shift at the nickel L shell energy loss near-edge position in the two samples was difficult whereas the present technique has made the chemical shift measurement in the two samples possible. As described above, according to the present invention, electron energy loss spectra can be acquired simultaneously from a plurality of samples and therefore, the measurement range of chemical shift can be broadened for samples difficult to measure till then and for example, a knowledge of the correlation between chemical shift and composition ratio can be gained.

The foregoing description has been given specifically on the basis of embodiments of the invention made by the present inventors but the present invention is in no way limited to the foregoing embodiments and can obviously be altered and modified in various ways without departing from the gist of the invention.

REFERENCE SIGNS LIST

1 Transmission electron microscope apparatus
2 Electron source
3 Electron beam
4 Condenser lens
6 Objective lens
7 Image-forming lens system
8 Electron spectrometer
9 Phosphor plate
10 Magnetic field selector
11, 12 Multi-pole lenses
13 Image detector
14 Image display unit
15 Data memory unit
16 Central control unit
17 Selected-area slit
18, 19, 48, 49 Samples
22 Sample movement control unit
23 Spectrum extraction button
24 Spectral image
25 Spectrum selection region tool
26 Selection button group
27 Chemical shift measurement button
28 Spectrum measurement start button
29 Electron energy loss spectrum display unit
30 Chemical shift display unit
31 Sample holder body
32 Sample stage clamp
33 Sample stage clamp screw
34 Piezoelectric device
40 Spectral image acquisition region
41 Silicon substrate
42 Nickel silicide
43 Nickel di-silicide
46, 47 Sample stages
51 Projecting portion
52 Sample stage fixing portion

The invention claimed is:

1. A transmission electron microscope apparatus comprising:
   an electron gun for emitting an electron beam;
   a condenser lens for converging the emitted electron beam;
   a plurality of sample stages irradiated with the converged electron beam and adapted to mount a plurality of samples;
   a sample movement control unit for moving said plurality of sample stages;
   image-forming lenses for forming an image of an electron beam having transmitted through said plurality of samples;
   an electron spectrometer adapted to perform spectrometry of the electron beam in accordance with energy amounts that the image-formed electron beam has and deliver spectral images obtained at convergence positions which are different in an energy dispersion axis direction and in a direction orthogonal to the energy dispersion axis direction to thereby acquire spectral images from the plurality of samples at a time; and
   an image display unit for displaying acquired spectral images, wherein:
   the plurality of samples mounted on said plurality of sample stages, respectively, are arranged in a direction orthogonal to the energy dispersion axis direction of said electron spectrometer,
   said plurality of sample stages on which the plurality of samples are mounted are arranged such that the converged electron beam is simultaneously irradiated onto samples mounted on more than two sample stages, and
   the plurality of samples are mounted such that electron beams transmitted through the plurality of samples are disposed in different positions in the direction orthogonal to the energy dispersion axis direction of said electron spectrometer.

2. The transmission electron microscope apparatus according to claim 1, wherein the plurality of samples mounted on said plurality of sample stages, respectively, are disposed in an illuminating area of the converged electron beam.

3. The transmission electron microscope apparatus according to claim 1, wherein said electron spectrometer is arranged between said image-forming lenses.

4. The transmission electron microscope apparatus according to claim 1, wherein at least one of said sample stages has, on opposite side to its sample stage fixing portion, a projecting portion for mounting one of said plurality of samples.

5. The transmission electron microscope apparatus according to claim 4, wherein a plurality of said projecting portions are arranged.

6. The transmission electron microscope apparatus according to claim 1, wherein the plurality of samples are mounted along a direction of a sample holder position corresponding to the direction orthogonal to the energy dispersion axis direction of said electron spectrometer.

7. A sample holder for a transmission electron microscope apparatus with an electron spectrometer, the sample holder comprising a plurality of sample stages mounted with samples, wherein:
   said samples are arranged in a direction orthogonal to an energy dispersion axis direction of the electron spectrometer,
   said plurality of sample stages on which the samples are mounted are arranged such that a converged electron beam is simultaneously irradiated onto samples mounted on more than two sample stages, and
   the samples are mounted such that electron beams transmitted through the samples are disposed in different positions in the direction orthogonal to the energy dispersion axis direction of said electron spectrometer.

8. The sample holder according to claim 7, wherein at least one of said sample stages is movable and said sample holder has a fine movement mechanism based on a piezoelectric device to move at least one of said samples in directions of triplet orthogonal axes.

9. The sample holder according to claim 7, wherein the samples are mounted along a direction of a sample holder position corresponding to the direction orthogonal to the energy dispersion axis direction of said electron spectrometer.

10. A method for acquiring spectral images, obtained by a transmission electron microscope apparatus provided with an electron spectrometer, which are formed in two orthogonal axes of an energy dispersion axis and position information, wherein:
    samples mounted on a plurality of sample stages, respectively, are arranged in a direction orthogonal to said energy dispersion axis and spectral images are captured at a time from said plurality of samples,
    said plurality of sample stages on which the samples are mounted are arranged such that a converged electron beam is simultaneously irradiated onto samples mounted on more than two sample stages, and
    the samples are mounted such that electron beams transmitted through the samples are disposed in different positions in the direction orthogonal to the energy dispersion axis direction of said electron spectrometer.

11. The spectral image acquisition method according to claim 10, wherein said plurality of samples are spaced apart from one another.

12. The spectral image acquisition method according to claim 10, wherein said plurality of samples are in contact with one another.

13. The spectral image acquisition method according to claim 10, wherein the samples mounted on said plurality of sample stages, respectively, are disposed in an illuminating area of an electron beam converged by a condenser lens.

14. The image acquisition method according to claim 10, wherein the samples are mounted along a direction of a sample holder position corresponding to the direction orthogonal to the energy dispersion axis direction of said electron spectrometer.

* * * * *